US009466964B1

(12) United States Patent
Watson et al.

(10) Patent No.: US 9,466,964 B1
(45) Date of Patent: Oct. 11, 2016

(54) MULTILEVEL CABLE MANAGEMENT SYSTEM

(71) Applicant: Amazon Technologies, Inc., Seattle, WA (US)

(72) Inventors: Christopher Nathan Watson, Seattle, WA (US); Christopher Strickland Beall, Woodinville, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/733,841

(22) Filed: Jun. 8, 2015

(51) Int. Cl.
| G06F 1/16 | (2006.01) |
| H05K 5/00 | (2006.01) |
| H05K 7/00 | (2006.01) |
| H02G 3/22 | (2006.01) |
| H05K 7/14 | (2006.01) |
| H05K 7/20 | (2006.01) |

(52) U.S. Cl.
CPC ............... *H02G 3/22* (2013.01); *H05K 7/14* (2013.01); *H05K 7/20136* (2013.01)

(58) Field of Classification Search
CPC .................................. H05K 7/14; H02G 3/22
USPC ............ 361/679.01, 679.02, 679.31, 679.32, 361/724–725; 312/223.1–223.3
See application file for complete search history.

(56) References Cited

U.S. PATENT DOCUMENTS

| 5,928,327 A * | 7/1999 | Wang ................. H04N 7/17336 348/E7.073 |
| 6,628,513 B1 * | 9/2003 | Gallagher ............... G06F 1/184 361/679.33 |
| 7,408,772 B2 * | 8/2008 | Grady ................. H05K 7/20581 165/122 |
| 7,487,283 B2 * | 2/2009 | Sivertsen .............. G06F 13/409 710/301 |
| 8,743,549 B2 * | 6/2014 | Frink ....................... G06F 1/187 361/679.49 |
| 9,001,514 B2 * | 4/2015 | Rust ......................... H05K 7/02 361/727 |

OTHER PUBLICATIONS

U.S. Appl. No. 14/668,795, filed Mar. 25, 2015, Darin Lee Frink, et al.
U.S. Appl. No. 13/234,067, filed Sep. 15, 2011, Peter G. Ross, et al.

\* cited by examiner

*Primary Examiner* — Anthony Haughton
(74) *Attorney, Agent, or Firm* — Robert C. Kowert; Meyertons, Hood, Kivlin, Kowert & Goetzel, P.C.

(57) ABSTRACT

A rack-mountable computer system includes a horizontal divider that divides a chassis interior of the computer system into a first level and a second level. A plurality of electronic components are mounted on the first level and a plurality of electronic components are mounted on a moveable tray of the second level. The horizontal divider includes one or more elongated openings and a plurality of cables that pass through the one or more elongated openings. The plurality of cables connect the electronic components mounted on the first level to the electronic components mounted on the moveable tray. The one or more elongated openings guide the plurality of cables to slide within the one or more elongated openings as the moveable tray is moved into or out of the chassis interior.

20 Claims, 7 Drawing Sheets

MULTILEVEL CABLE MANAGEMENT SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Some computer systems, such as servers, include a number of components that are mounted in an interior of the computer systems. Such components include printed circuit boards, mass storage devices, storage device controllers, power supplies, processors, and other similar components. The components may be connected to one or more other components in the computer system via data cables. Also power cables may supply power to one or more of the components in a computer system from one or more power supply units.

In some cases, a computer system mounted in a rack includes one or more hot-pluggable electronic components, which can be added, removed, swapped, etc. from a computer system without powering down the computer system. Hot-pluggable electronic components in a computer system are often mounted at an external side of the computer system, including a "front" side through which cooling air is received into the computer system, to enable simplified access to the components for removal, addition, swapping, etc. In addition, mounting hot-pluggable electronic components to an external side of the computer system enables hot swapping without moving the computer system itself. Mounting hot-pluggable electronic components throughout the depth of the computer system interior can hamper hot-swapping efforts while maintaining operations by other hot-pluggable electronic components. Furthermore, as indicated above, mounting hot-pluggable electronic components throughout the depth of the interior can result in preheating of cooling air which removes heat from some components which are downstream of other components, which can reduce cooling efficiency and can negatively affect component performance.

In some cases, a computer system that includes hot-pluggable electronic components includes a cable management arm that manages cables connected to the components as a moveable tray is moved into and out of the computer system. A cable management arm may include one or more structural components that move with a moveable tray when the tray is moved out of a computer system and that retract with a moveable tray when the tray is moved into a computer system. Computer systems mounted in a rack may require separate cable management arms for each computer system mounted in a rack. A cable management arm may include multiple structural components and additional lengths of cable that add additional weight to a computer system. The structural components and additional lengths of cable of a cable management arm may occupy a volume in a server chassis that would otherwise be available to mount electronic components and may block air flow within the chassis.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of multilevel cable management systems, and methods of operating multilevel cable management systems, are disclosed. According to one embodiment, a system includes a plurality of computer systems mounted in a rack, wherein at least one of the computer systems includes, a chassis at least partially encompassing a chassis interior that includes at least two levels, a plurality of storage controller devices mounted within a first level of the at least two levels (for example a plurality of peripheral component interconnect express or PCIe cards mounted within the first level), a plurality of mass storage devices mounted on a moveable tray within a second level of the at least two levels (for example a plurality of hard disk drives or solid state drives mounted on the moveable tray within the second level), a plurality of cables configured to connect the storage controller devices to the mass storage devices, and a horizontal divider at least partially separating the first level from the second level. The horizontal divider includes one or more elongated openings between the first level and the second level and the plurality of cables pass from the first level to the second level through the one or more elongated openings. The one or more elongated openings are configured to guide the plurality of cables to slide within the one or more elongated openings when the moveable tray is at least partially moved out of and into the chassis and the one or more elongated openings are elongated in a direction of movement for the moveable tray.

According to one embodiment, an apparatus includes a chassis at least partially encompassing a chassis interior that includes at least two levels. The apparatus includes multiple electronic components mounted within a given level of the at least two levels and a plurality of electronic components mounted on a moveable tray within another level of the at least two levels. The apparatus includes a plurality of cables configured to connect the electronic components of the given level to the electronic components of the other level, and includes a horizontal divider at least partially separating the given level from the other level, wherein the horizontal divider comprises one or more elongated openings between the given level and the other level. The plurality of cables pass from the given level to the other level through the one or more elongated openings and the one or more elongated openings are configured to guide the plurality of cables to slide within the one or more elongated openings when the moveable tray is at least partially moved out of and into the chassis, wherein the one or more elongated openings are elongated in a direction of movement for the moveable tray.

According to one embodiment, a method includes moving a moveable tray of a computer system. The computer system includes a chassis enclosing a chassis interior including at least two levels. Moving the moveable tray includes one or more elongated openings in a horizontal divider between the at least two levels guiding a plurality of cables that pass through the one or more elongated openings to connect electronic components mounted in a given level of the at least two levels to electronic components mounted on the moveable tray on another level of the at least two levels, wherein the one or more elongated openings are elongated in a direction of movement for the moveable tray.

As used herein, "air moving device" includes any device, element, system, or combination thereof that can move air. Examples of air moving devices include fans, blowers, and compressed air systems.

As used herein, "backplane" means a plate or board to which other electronic components, such as mass storage devices, circuit boards, can be mounted. In some embodiments, mass storage devices, which can include one or more hard disk drives or solid state drives, are plugged into a backplane in a generally horizontal orientation relative to the face of the backplane. In some embodiments, a backplane includes and one or more power buses that can transmit power to components on the backplane, and one or more data buses that can transmit data to and from components installed on the backplane.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, a "rack" means a rack, container, frame, or other element or combination of elements that can contain or physically support one or more computer systems.

Some computer systems with a moveable tray include a cable management arm. A cable management arm may include structural components that fold up in a back portion of a server chassis and extend with the moveable tray when the moveable tray is at least partially moved out of a chassis interior. A cable management arm may also include extra lengths of cables that are folded along the folded structural components of the cable management arm. A cable management arm may occupy a volume of space in a server that could otherwise be used to house additional electronic components. A cable management arm may also add additional costs and weight to server systems. The structural components and extra lengths of cable of a cable management arm may block air flow within a chassis of a computer system. For example, air may flow from an intake end to an exhaust end of a chassis. A cable management arm proximate to an exhaust end of a chassis may impede air flow through the exhaust of the chassis and consequently lower the amount of air flowing through the chassis.

A multilevel cable management system may comprise one or more elongated openings that are elongated in a direction of travel of a moveable tray and guide cables in the one or more openings when a moveable tray is moved into or out of a chassis of the computer system without using a cable management arm.

Figure 1:
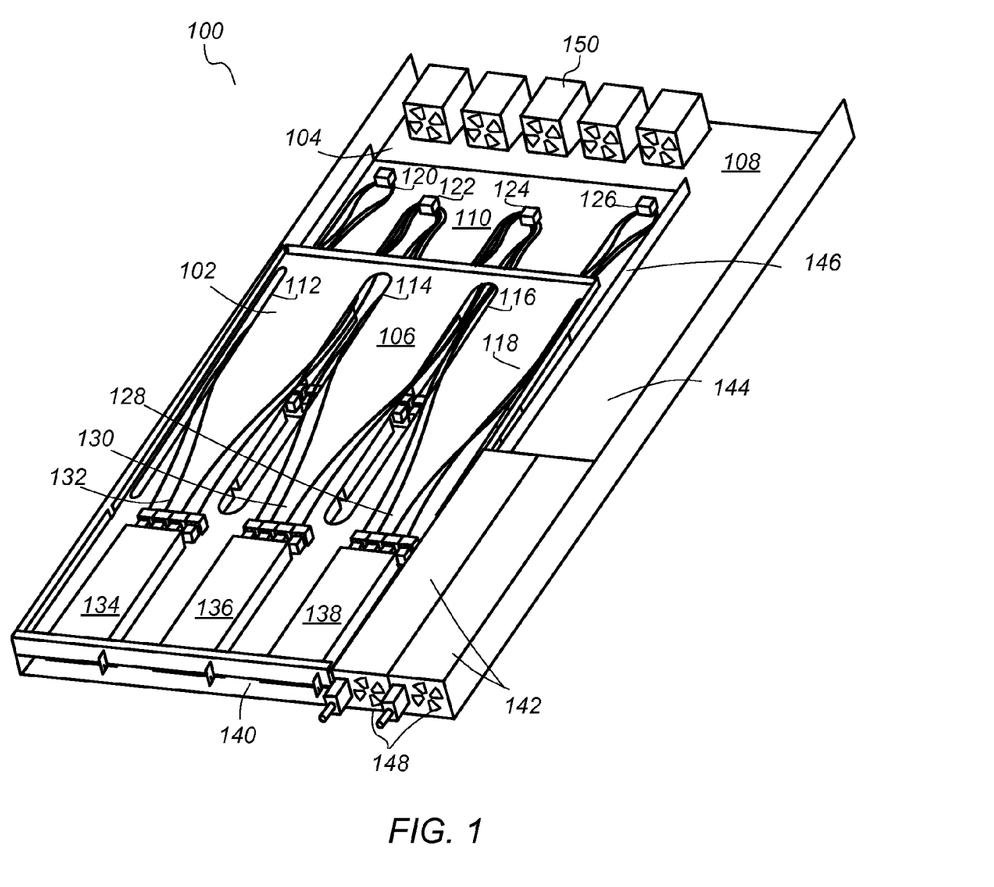
FIG. 1 is a perspective view of a computer system with a multilevel cable management system, according to some embodiments.

FIG. 1 illustrates a perspective view of a computer system with a multilevel cable management system, according to some embodiments. A computer system with a multilevel cable management system may include a horizontal divider that divides a chassis interior of a computer system into two levels. For example, computer system 100 includes horizontal divider 102 that divides chassis interior 104 into first level 106 and second level 108. A horizontal divider in a computer system with a multilevel cable management system may include one or more elongated openings between a first level of the computer system and a second level of the computer system. The one or more elongated openings may be elongated in a direction of travel for a moveable tray. For example, computer system 100 includes moveable tray 110 on second level 108. Elongated openings 112, 114, 116, and 118 are elongated in a direction of travel of moveable tray 110. The one or more elongated openings may be aligned with a space between successive columns of electronic components mounted on a second level of the computer system below the one or more elongated openings. One or more tie-down points may be aligned with the one or more elongated openings, the tie-down points may be mounted on a moveable tray such that the tie-down points move below the one or more elongated openings when the movable tray is moved into and out of a chassis of the computer system with a multilevel cable management system. For example tie-down points 120, 122, 124, and 126 are mounted on moveable tray 110 such that tie-down points 120, 122, 124, and 126 move below elongated openings 112, 114, 116, and 118 when moveable tray 110 is moved into and out of chassis interior 104.

A plurality of cables may pass through the one or more elongated openings to connect a plurality of electronic components mounted on the first level to a plurality of electronic components mounted on the second level. In some embodiments, the plurality of electronic components mounted on the first level may be a plurality of storage controller devices (e.g. PCIe cards) that control a plurality of mass storage devices (e.g. hard disk drives, solid state drives, etc.) mounted on a moveable tray on the second level. For example, cables 128, 130, and 132 connect storage device controllers 134, 136, and 138 to mass storage devices mounted on movable tray 110 of second level 108 (note in FIG. 1 the mass storage devices are hidden beneath horizontal divider 102). The one or more elongated openings may be configured to guide the plurality of cables in the one or more elongated openings as the moveable tray is moved into and out of the chassis interior. In some embodiments, the one or more elongated openings may guide the plurality of cables into and out of spaces between successive columns of electronic components mounted on a second level of the computer system below the one or more elongated openings.

A computer system with a multilevel cable management system may include an air intake that distributes air received into a chassis interior of the computer system between a first level of the computer system and a second level of the computer system. For example air intake 140 may distribute air received into chassis interior 104 between first level 106 and second level 108. In some embodiments an air intake, such as air intake 140, may include one or more adjustable openings to adjust a distribution of air between a first level and a second level of a computer system with a multilevel cable management system.

In some embodiments, the one or more elongated openings may be configured to mix air flowing in a first level of a chassis interior with air flowing in a second level of a chassis interior in addition to being configured to pass a plurality of cables through the one or more elongated openings to connect electronic components mounted on the first level of the chassis interior to electronic components mounted on a moveable tray of the second level of the chassis interior. For example, elongated openings 112, 114, 116, and 118 may be configured to mix air flowing in first level 106 with air flowing in second level 108. In some embodiments, air flowing in a first level of a chassis interior at a location of the one or more elongated openings may have a lower temperature than air flowing in a second level of a chassis interior at the location of the one or more elongated openings. For example, a first level may comprise fewer electronic components than a second level, so that air flowing in the first level at the location of the one or more elongated openings may have passed over fewer electronic components than air flowing in the second level at the location of the one or more elongated openings. In some embodiments, electronic components on a first level of a chassis interior may generate less waste heat than electronic components mounted on a moveable tray on a second level of a chassis interior, so that air flowing in a first level of a chassis interior at the location of the one or more elongated openings may have absorbed less waste heat than air flowing in a second level of a chassis interior at the location of the one or more elongated openings. Mixing cooler air flowing in a first level of a chassis interior with air flowing in a second level of a chassis interior may increase the volumetric flow of the air flowing in the second level and reduce the overall temperature of the air flowing in the second level. In some embodiments, one or more electronic components may be mounted on the moveable tray downstream of the one or more elongated openings so that combined air that includes at least a portion of the cooler air from the first level flows over the one or more electronic components mounted on the moveable tray downstream from the one or more elongated openings. The combined air that has a higher volumetric flowrate than the air flowing in the second level upstream of the one or more elongated openings and that has a lower temperature than the air flowing in the second level upstream of the one or more elongated openings may remove more waste heat from the downstream electronic components than air flowing in systems that do not include one or more elongated openings that are configured to mix air flowing in a first level of a chassis interior with air flowing in a second level of a chassis interior.

In some embodiments, a computer system with a multilevel cable management system may include one or more power supply units mounted within a chassis interior of the computer system. For example, computer system 100 includes power supplies 142 mounted within chassis interior 104. In some embodiments power supply units included in a computer system with a multilevel cable management system may be mounted in a separate portion of a chassis interior that is at least partially isolated from a first level and a second level of the chassis interior. The separate portion may be separated by a horizontal divider. For example, power supply units 142 are mounted in separate portion 144 that is separate from first level 106 and second level 108. Partition 146 at least partially isolates separate portion 144 from first level 106 and second level 108. A separate portion of a chassis interior that is at least partially isolated from a first level and a second level may receive air at an air intake that is separate from an air intake that distributes air between the first level and the second level. For example, power supply units 142 receive air via separate intakes 148. A separate portion containing power supply units that is at least partially isolated from a first level and a second level of a chassis interior may include an at least partially isolated air flow, so that heated air that has passed through power supply units to cool the power supply units does not mix with air flowing in the first level and second level of the chassis interior.

A computer system with a multilevel cable management system may include one or more air moving devices mounted at an exhaust end of a chassis of the computer system. The air moving devices may be fans mounted at the exhaust end of the chassis that create a pressure differential within a chassis interior of the computer system that causes air to be drawn into the chassis interior at the intake end. For example, fans 150 may create a pressure differential within chassis interior 104 that causes air to be drawn into chassis interior 104 via air intake 140 and separate air intakes 148.

Figure 2:
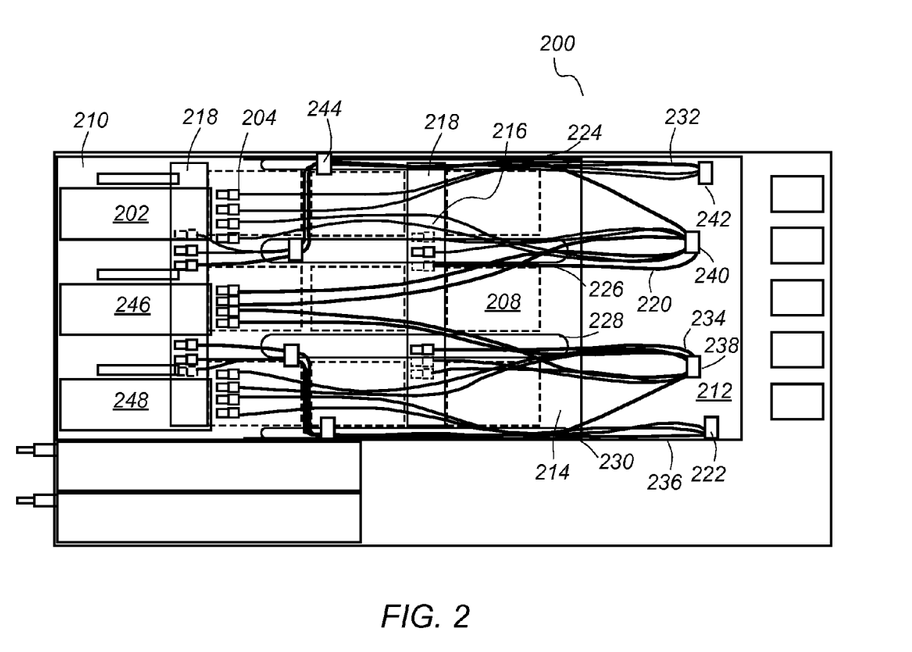
FIG. 2 is a top view of a computer system with a multilevel cable management system, according to some embodiments.

FIG. 2 is a top view of a computer system with a multilevel cable management system, according to some embodiments. FIG. 2 illustrates an example of a computer system with a multilevel cable management system wherein a moveable tray in a second level of the computer system is moved to be within the chassis interior. Computer system 200 illustrated in FIG. 2 may be the same as a computer system 100 illustrated in FIG. 1. Computer system 200 includes storage device controllers 202 and associated connectors 204 mounted on first level 210 that are connected to mass storage devices 208 and associated connectors 216 on backplanes 218 mounted on moveable tray 214 on second level 212. A portion of the cables from each set of connectors associated with a storage device controller pass through one of one or more elongated openings to a second level of a chassis interior and another portion of the cables from each set of connectors associated with a storage device controller pass through another one of the one or more elongated openings to the second level of the chassis interior. The one or more elongated openings are aligned with a space between successive columns of mass storage devices on a second level of the chassis interior so that the cables passing through the one or more elongated openings pass from the first level into the spaces between columns of mass storage devices on the second level.

One or more tie-down points are mounted on the moveable tray on the second level and are aligned with the one or more elongated openings, so that the tie-down points at least partially secure a portion of the plurality of cables in the space between successive columns of mass storage devices. After passing from the first level to the second level via the one or more elongated openings, sets of the plurality of cables are routed to the tie-down points mounted on the moveable tray on the second level. From the tie-down points on the second level the cables are routed to separate groups of connectors that are mounted on backplanes mounted on the moveable tray. The backplanes are also connected to the individual mass storage devices and allow communications to be sent to and received from the mass storage devices connected to the backplanes.

For example, mass storage devices 208 are connected to backplanes 218 and connectors 216 are connected to backplanes 218. Communications flow between storage device controllers 202, 246, and 248 and mass storage devices 208 via connectors 204 coupled to cables 220, 232, 234, and 236 coupled to connectors 216 connected to backplanes 218, which are connected to mass storage devices 208 (for simplicity of illustration connectors to storage device controller 202 are labeled as connectors 214, however it should be understood that connectors 214 includes connectors for storage device controllers 246 and 248. Also a single set of connectors for mass storage devices 208 are labeled as connectors 216. However, it should be understood that mass storage devices 208 are connected to cables via multiple sets of connectors, such as connectors 216). Cables 232 pass through elongated opening 224, cables 220 pass through elongated opening 226, cables 234 pass through elongated opening 228, and cables 236 pass through elongated opening 230. Cables 236 are at least partially secured to moveable tray 214 in a space between a row of mass storage devices 208 and an edge of the chassis interior by tie-down point 222. Cables 234 are at least partially secured between successive columns of mass storage devices 208 by tie-down point 238. Cables 220 are at least partially secured between successive columns of mass storage devices 208 by tie town point 240, and cables 232 are at least partially secured between a row of mass storage devices 208 and an edge of the chassis interior by tie-down point 242. In some embodiments, additional tie-down points may be used to secure cables routed to backplanes. For example, cables 232 are routed to a backplane 218 that is nearest the intake end of the chassis interior. Cables 232 are routed along the edge of the chassis interior between the edge of the chassis interior and a row of mass storage devices 208. Cables 232 then pass between a column of mass storage devices to arrive at connectors mounted on backplane 218. Additional tie-down points 244 are located on either side of the mass storage devices 208 as cables 232 pass between the column of mass storage devices (for simplicity of illustration only one of the two additional tie-down points 244 is labeled). Cables 236 are routed in a similar fashion as cables 232 and are secured by additional tie-down points. In some embodiments, cables, such as one of cables 220 may be routed such that after passing through a tie-down point, such as tie-down point 240, it is routed to join with another set of cables, such as cables 232 to be routed to a group of connectors associated with the other set of cables.

FIGS. 1 and 2 illustrate a computer system with a multilevel cable management system that routes cables from three electronic components mounted on a first level to twelve electronic components mounted on a moveable tray on a second level. In some embodiments, a computer system with a multilevel cable management system may include more or less electronic components on a first level, more or less electronic components on a second level, more or less cables connecting the electronic components via elongated openings, and may include more or less elongated openings.

FIGS. 1 and 2 are an example of a computer system with a multilevel cable management system that includes electronic components that are storage device controllers mounted on a first level and mass storage devices mounted on a moveable tray on a second level. In some embodiments, a computer system with multilevel cable management may include other types of electronic components on a first level and on a moveable tray of a second level.

Figure 3:
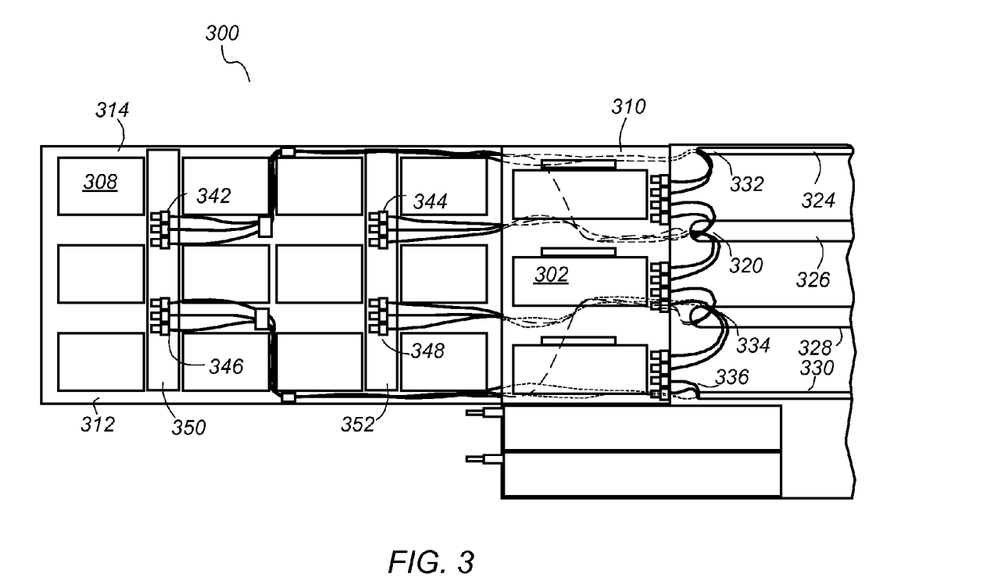
FIG. 3 is a top view of a computer system with a multilevel cable management system, according to some embodiments.

FIG. 3 is a top view of a computer system with a multilevel cable management system, according to some embodiments. FIG. 3 illustrates an example of a computer system with a multilevel cable management system wherein a moveable tray in a second level of the computer system is moved at least partially out of a chassis interior. Computer system 300 illustrated in FIG. 3 may be the same as computer system 100 illustrated in FIG. 1 or computer system 200 illustrated in FIG. 2. Cables 320, 332, 334, and 336 and elongated openings 324, 326, 328, and 330 may be the same as the corresponding cables and elongated openings illustrated in FIG. 2. As a moveable tray is moved out of a chassis interior of a computer system with a multilevel cable management system, cables passing from a first level of the chassis interior to a second level of the chassis interior may be guided from the first level to the second level by the one or more elongated openings. When a tray is fully inserted into a chassis interior, a length of cable from a connector mounted on a first level of the chassis interior may pass through an elongated opening to a tie-down point mounted on a moveable tray on the second level of the chassis interior. The length of cable may have a slight rigidity such that the cable forms an arch between the connector on the first level and the tie-down point on the moveable tray on the second level. A portion of the arched length of cable may be in the first level and a portion may be in the second level of the chassis interior. As the moveable tray is moved out of the chassis interior, the arched length of cable may be pulled into the second level to allow the moveable tray to slide out of the chassis interior. When the moveable tray is in an extended position the portion of the length of the arched cable in the first level may be transferred to the second level and be routed in a space between columns of mass storage devices mounted on the moveable tray on the second level. As the moveable tray is returned into the chassis interior, the length of cable may be returned back so that the length of cable forms an arched shape with the arched cable situated in an elongated opening with a portion of the arched length of cable in the first level and a portion of the arched length of cable in the second level. FIG. 3 shows moveable tray 314 in an extended position, cables 320, 332, 334, and 336 have been pulled from having a portion of a length of cable in first level 310 to having the length of cable pulled into second level 312. Cables 320, 332, 334, and 336 are routed from storage device controllers 302 on first level 310 through elongated openings 324, 326, 328 and 330 and in spaces between columns of mass storage devices 308 on moveable tray 314 to connectors 342, 344, 346, and 348 on backplanes 350 and 352. In FIG. 3 the dotted or dashed portions of cables 320, 332, 334, and 336 indicate a portion of the cables that are hidden below first level 310.

In some embodiments, computer systems 100, 200 and 300 illustrated in FIGS. 1, 2, and 3 may include power cables routed from power supply units to electronic components mounted on a first level and a second level of the computer systems. The power cables may be routed through the one or more elongated openings of the computer systems with multilevel cable management systems in addition to cables connecting the electronic components on the first level to the electronic components mounted on the second level.

Figure 4A:
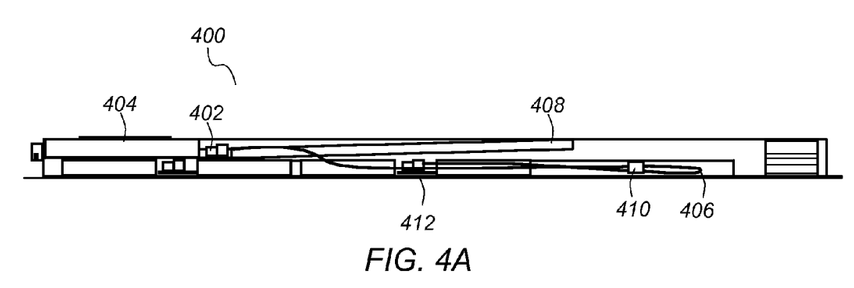
FIG. 4A is a side view of a computer system with a multilevel cable management system, according to some embodiments.
Figure 4B:
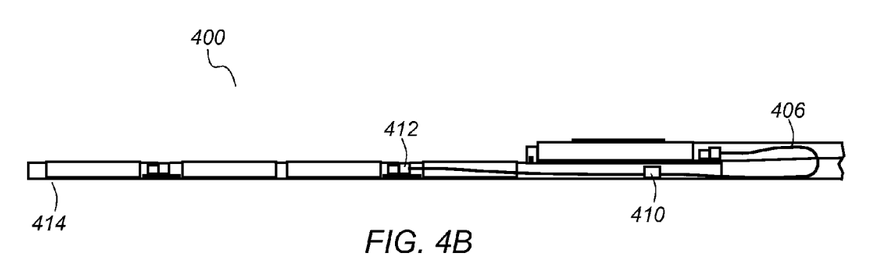
FIG. 4B is a side view of a computer system with a multilevel cable management system, according to some embodiments.

FIGS. 4A and 4B are a side views of a computer system with a multilevel cable management system, according to some embodiments. Computer system 400 may be the same computer system as computer systems 100, 200, and 300 illustrated in FIGS. 1, 2, and 3. Computer system 400 includes connectors that connect storage device controller 404 to cable 406. Cable 406 passes through an elongated opening in horizontal divider 408 to tie-down point 410 and is routed from tie-down point 410 to connectors 412 on a backplane of a moveable tray. FIG. 4B illustrates tie-down point 410 moving with moveable tray 414 as moveable tray 414 is moved out of a chassis interior of computer system 400. Cable 406 moves with tie-down point 410 so that a looped length of cable 406 is stretched out allowing moveable tray 414 to move at least partially out of computer system 400.

Figure 5:
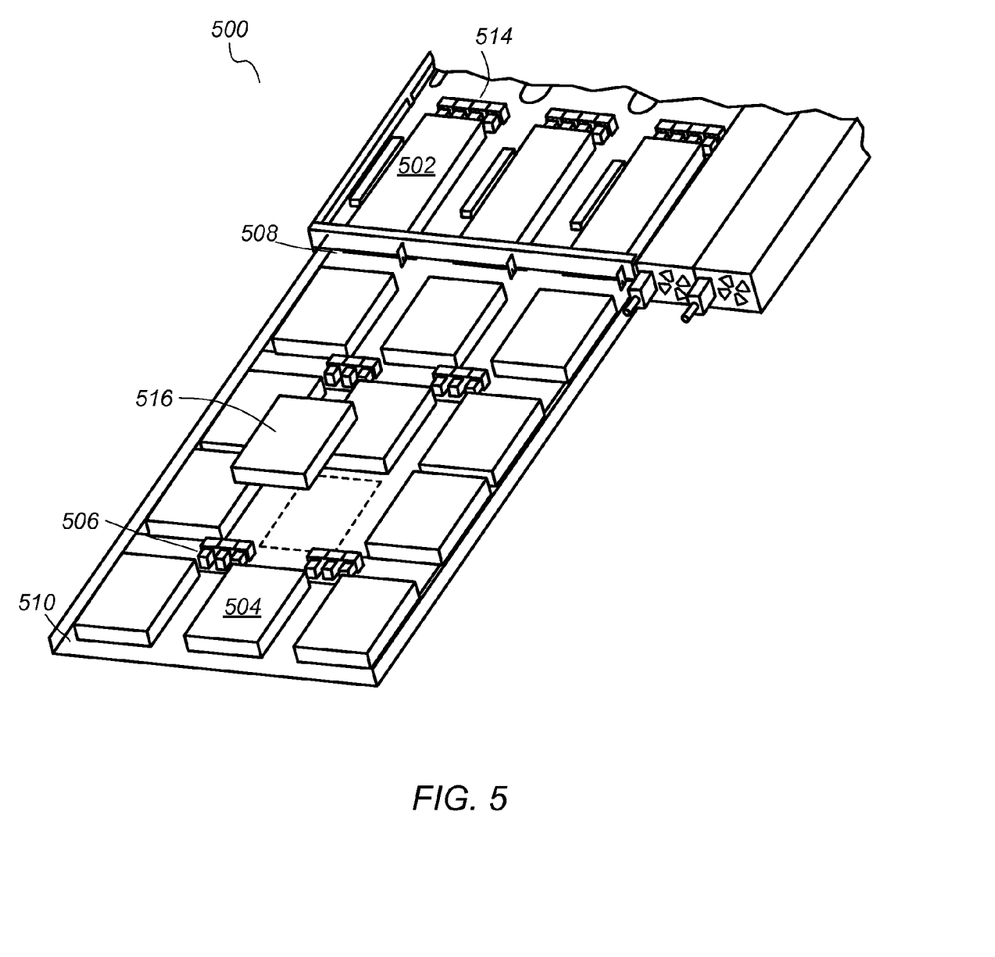
FIG. 5 is a perspective view of a computer system with a multilevel cable management system, according to some embodiments.

FIG. 5 is a perspective view of a computer system with a multilevel cable management system, according to some embodiments. FIG. 5 illustrates an example of a hot-pluggable electronic component being removed from a moveable tray in an at least partially extended position. For clarity, cables connecting storage device controllers to mass storage devices are not illustrated, but it should be understood that storage device controllers 502 are connected to mass storage devices 504 via a plurality of cables passing through one or more elongated openings. Electronic components, such as mass storage devices 504, and backplane components, such as backplane connectors 506, may be mounted on a partially removable tray, such as tray 510. The electronic components mounted on a partially removable tray may be hot-pluggable components. A partially removable tray, such as tray 510, may be partially removed from a chassis, such as chassis 508, to allow access to hot-pluggable electronic components mounted on the tray, such as mass storage devices 512 mounted on tray 510. One or more cables (not shown) may connect electronic components mounted on a first level of a computer system with electronic components mounted on a second level of a computer system with a multilevel cable management system. For example, storage controllers 502 may be connected to mass storage devices 504, via connectors 506 connected to connectors 514 by one or more cables (not shown). Cables connecting electronic components of a first level of a computer system to electronic components on a second level of a computer system may pass through one or more elongated openings in a horizontal divider of the computer system. A hot-pluggable electronic component, such as mass storage device 516 of mass storage devices 504 may be removed from a backplane while a remaining one or more electronic components, such as mass storage devices 504, continue to operate.

Figure 6:
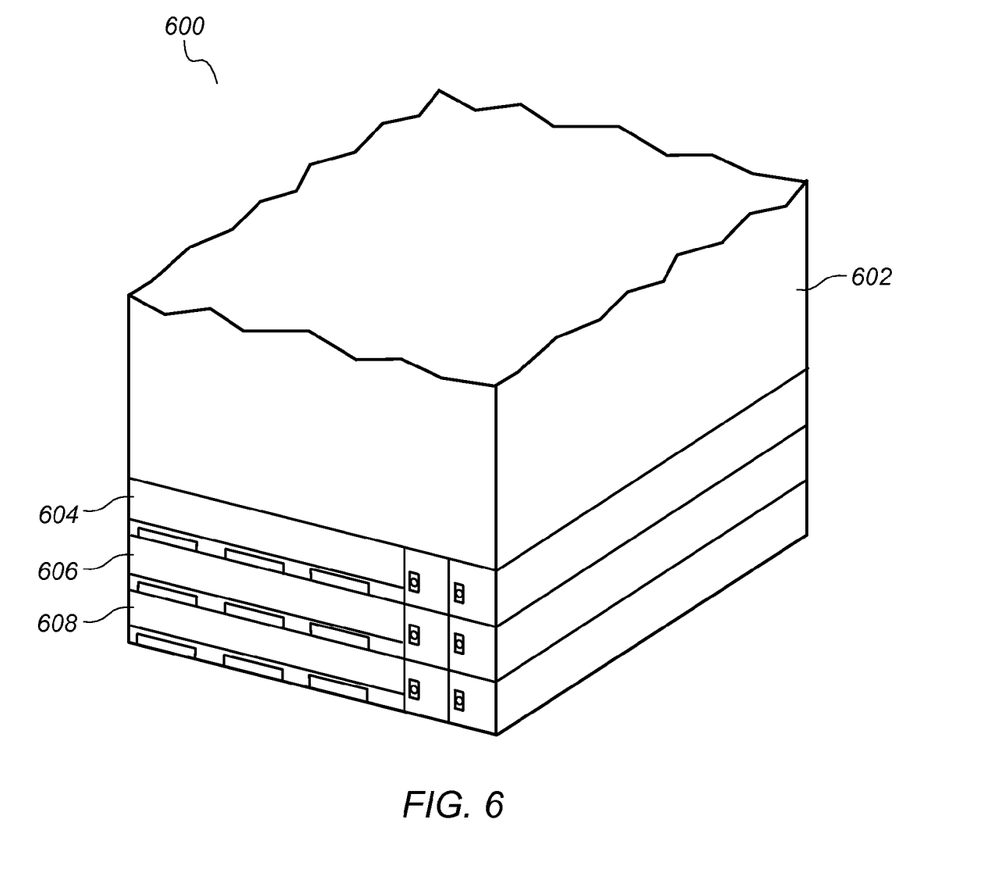
FIG. 6 illustrates a rack comprising multiple computer systems with multilevel cable management systems, according to some embodiments.

FIG. 6 illustrates a computer system with a multilevel cable management system mounted in a rack, according to some embodiments. Any of the computer systems described in regards to FIGS. 1-7 may be mounted in a rack. A rack may be a standard 19" rack with 1U slots. A rack may be part of a datacenter comprising multiple computer systems with multilevel cable management systems. For example, multiple computer systems with multilevel cable management systems in a data center may include multiple data storage servers used to implement a data storage system. In some embodiments, multiple computer systems with multilevel cable management systems may be used to implement a computing service. In some embodiments one or more computer systems with multilevel cable management systems may be used for other purposes. In FIG. 6 rack system 600 includes rack 602 and computer systems with multilevel cable management systems 604, 606, and 608. Computer systems 604, 606, and 608 may be any of computer systems with multilevel cable management systems described in FIGS. 1-7, such as computer systems 100, 200, 300, 400, and 500 described in FIGS. 1-5.

Figure 7:
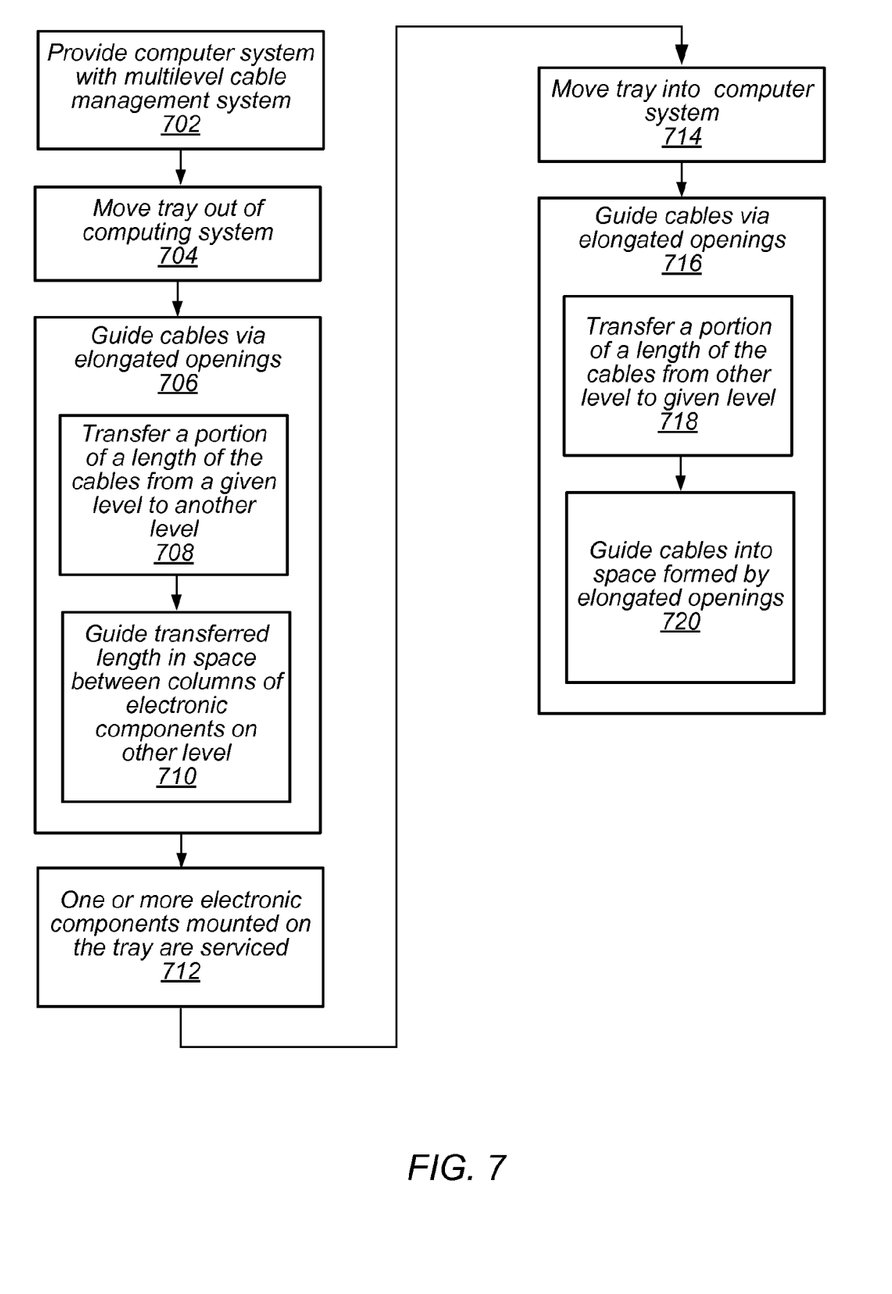
FIG. 7 illustrates a method of using a computer system with a multilevel cable management system, according to some embodiments.

FIG. 7 illustrates a method of moving a tray of a computer system with a multilevel cable management system, according to some embodiments. The illustrated method can be implemented with regard to one or more of the computer systems illustrated herein.

At 702, a computer system with a multilevel cable management system is provided. The computer system with a multilevel cable management system includes a horizontal divider that at least partially divides a chassis interior of the computer system into two levels, a given level and another level. The horizontal divider includes one or more elongated openings. Electronic components mounted on the given level are connected to electronic components on the other level by a plurality of cables that pass through the one or more elongated openings in the horizontal divider. The elongated openings are elongated in a direction of travel for a moveable tray of the other level. Electronic components of the other level are mounted on a moveable tray.

At 704, the movable tray is moved out of a chassis interior of a computer system with a multilevel cable management system. The electronic components of the other level mounted on the moveable tray move with the moveable tray so that when the moveable tray is at least partially moved out of the chassis interior, the electronic components mounted on the moveable tray are accessible for hot-plug serviceability. One or more tie-down points may be included on the moveable tray, so that the one or more tie-down points move with the moveable tray. The one or more tie-down points may at least partially secure sets of the plurality of cables to the moveable tray of the other level.

At 706, the one or more elongated openings guide the cables passing though the one or more elongated openings as the moveable tray is moved out of the chassis interior. In some embodiments, the tie-down points mounted on the moveable tray may be aligned with the one or more elongated openings so that the tie-down points move beneath the one or more elongated openings when the moveable tray is moved out of or into the chassis interior.

At 708, as part of the one or more elongated openings guiding the cables as the moveable tray is moved out of the chassis interior, the one or more elongated openings guide a portion of a length of the plurality of cables that is being transferred from the given level to the other level.

At 710, as part of the one or more elongated openings guiding the cables as the moveable tray is moved out of the chassis interior, the one or more elongated openings guide a given length of the plurality of cables transferred from the given level to the other level via the one or more elongated openings into a space between successive columns of electronic components mounted on the moveable tray. In some embodiments, the one or more elongated openings may be aligned with the spaces between successive columns of electronic components mounted on the moveable tray.

At 712, one or more electronic components mounted on the moveable tray that has been moved at least partially out of the chassis of the computer system with a multilevel cable management system are serviced. The electronic components may be hot-pluggable so that one or more particular electronic components can be removed from the moveable tray and adjusted or replaced without disconnecting the remaining electronic components mounted on the moveable tray. In addition, the remaining electronic components mounted on the moveable tray may continue to operate while the moveable tray is extended and the one or more particular electronic components are being adjusted or replaced.

At 714, after one or more electronic components mounted on the moveable tray are serviced, the tray may be moved back into the chassis of the computer system.

At 716, in response to and while the moveable tray is being moved back into the chassis of the computer system, the one or more elongated openings of the computer system may guide the plurality of cables into a space that includes the one or more elongated openings. Guiding the cables into the space that includes the one or more elongated openings while the moveable tray is being moved back into the chassis interior may return the cables to a position the cables were in prior to the moveable tray being moved out of the chassis interior of the computer system at 704.

At 718 as part of guiding the cables as the moveable tray is moved into the chassis of the computer system, the one or more elongated openings may guide a length of the plurality of cables into the one or more elongated openings such that a portion of the length of the plurality of cables is transferred back to the given level from the other level.

At 720, as part of guiding the cables as the moveable tray is moved into the chassis of the computer system, the one or more elongated openings may guide the cables including the transferred portion of a length of the plurality of cables into a space that is formed by the one or more elongated openings and includes a space between successive columns of electronic components mounted on the moveable tray below the one or more elongated openings.

In some embodiments, a computer system with a multilevel cable management system may include a separate portion comprising one or more power supply units. In some embodiments, elongated openings in a computer system with a multilevel cable management system may guide power cables from power supply units of a computer system with a multilevel cable management system to pass between levels of the computer system.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
    a plurality of computer systems mounted in a rack, wherein at least one of the computer systems comprises:
        a chassis at least partially encompassing a chassis interior comprising at least two levels;
        a plurality of storage controller devices mounted within a first level of the at least two levels;
        a plurality of mass storage devices mounted on a moveable tray within a second level of the at least two levels;
        a plurality of cables configured to connect the storage controller devices to the mass storage devices; and
        a horizontal divider at least partially separating the first level from the second level, wherein the horizontal divider comprises one or more elongated openings between the first level and the second level;
    wherein the plurality of cables pass from the first level to the second level through the one or more elongated openings, and wherein the one or more elongated openings are configured to guide the plurality of cables to slide within the one or more elongated openings when the moveable tray is at least partially moved out of and into the chassis, wherein the one or more elongated openings are elongated in a direction of movement for the moveable tray.

2. The system of claim 1, wherein the one or more elongated openings are configured to guide the plurality of cables to slide within the one or more elongated openings when the moveable tray is at least partially moved out of and into the chassis, such that:
    a given length of the plurality of cables is transferred from the first level to the second level when the tray is at least partially removed from the chassis interior, and
    the given length of the plurality of cables is returned to the first level from the second level when the moveable tray is moved into the chassis interior.

3. The system of claim 1, wherein the one or more elongated openings are configured to guide the plurality of cables as the movable tray is at least partially moved out of and into the chassis without using a cable management arm.

4. The system of claim 1, further comprising one or more tie-down points configured to secure one or more sets of the plurality of cables to the moveable tray, wherein the one or more tie-down points are mounted on the moveable tray such that the one or more tie-down points are aligned with the one or more elongated openings.

5. The system of claim 4, wherein the one or more tie-down points are further configured to provide strain relief to connections that connect the plurality of cables to the storage device controllers and connect the plurality of cables to the mass storage devices.

6. The system of claim 1, wherein the plurality of mass storage devices mounted on the moveable tray are mounted in a plurality of columns wherein each column comprises a plurality of mass storage devices, and wherein there is a space between successive columns of mass storage devices.

7. The system of claim 6, wherein the one or more elongated openings are aligned with respective spaces between columns of mass storage devices mounted on the moveable tray.

8. The system of claim 1, wherein respective ones of the plurality of mass storage devices mounted on the moveable tray are configured for hot-plug serviceability while the tray is at least partially moved out of the chassis interior.

9. The system of claim 1, wherein the at least one computer system is configured to mount within a 1U slot of the rack.

10. An apparatus comprising:
a chassis at least partially encompassing a chassis interior comprising at least two levels;
a plurality of electronic components mounted within a given level of the at least two levels;
a plurality of electronic components mounted on a moveable tray within another level of the at least two levels;
a plurality of cables configured to connect the electronic components of the given level to the electronic components of the other level; and
a horizontal divider at least partially separating the given level from the other level, wherein the horizontal divider comprises one or more elongated openings between the given level and the other level;
wherein the plurality of cables pass from the given level to the other level through the one or more elongated openings, and wherein the one or more elongated openings are configured to guide the plurality of cables to slide within the one or more elongated openings when the moveable tray is at least partially moved out of and into the chassis, wherein the one or more elongated openings are elongated in a direction of movement for the moveable tray.

11. The apparatus of claim 10 further comprising one or more tie-down points configured to secure one or more sets of the plurality of cables to the moveable tray, wherein the one or more tie-down points are mounted on the moveable tray such that the one or more tie-down points are aligned with the one or more elongated openings.

12. The apparatus of claim 10, wherein the one or more elongated openings are configured to guide the plurality of cables as the movable tray is at least partially moved out of and into the chassis without using a cable management arm.

13. The apparatus of claim 10, wherein respective ones of the electronic components mounted on the moveable tray are configured for hot-plug serviceability while the tray is at least partially moved out of the chassis interior.

14. The apparatus of claim 10, further comprising one or more power supply units and one or more power cables that connect the one or more power supply units to at least some of the electronic components mounted in the given level and the other level;
wherein the one or more elongated openings are further configured to guide the one or more power cables between the given level to the other level when the moveable tray is at least partially moved out of and into the chassis interior.

15. A method comprising:
moving a moveable tray of a computer system, wherein the computer system comprises a chassis enclosing a chassis interior that comprises at least two levels, wherein moving the moveable tray comprises:
guiding, by one or more elongated openings in a horizontal divider between the at least two levels, a plurality of cables, wherein the cables pass through the one or more elongated openings to connect electronic components mounted in a given level of the at least two levels to electronic components mounted on the moveable tray on another level of the at least two levels, wherein the one or more elongated openings are elongated in a direction of movement for the moveable tray.

16. The method of claim 15 wherein said guiding comprises:
transferring a given length of the plurality of cables from the given level to the other level as the moveable tray is at least partially removed from the chassis interior; and
transferring the given length of the plurality of cables into the given level from the other level as the movable tray is at least partially moved into the chassis interior.

17. The method of claim 15, wherein said guiding, by the one or more elongated openings, is performed without a cable management arm.

18. The method of claim 15, wherein said guiding, by the one or more elongated openings, comprises guiding one or more sets of the plurality of cables in one or more spaces between successive columns of the electronic components that are mounted on the moveable tray, wherein respective ones of the one or more elongated openings are aligned with respective ones of the one or more spaces between successive columns of the electronic components.

19. The method of claim 15, wherein one or more tie-down points secure one or more sets of the plurality of cables to the moveable tray and wherein the one or more tie-down points are aligned with the one or more elongated openings.

20. The method of claim 15, further comprising mixing cooling air flowing through the given level with cooling air flowing through the other level, wherein to mix the cooling air, the cooling air in the given level is directed through the one or more elongated openings into the other level.

* * * * *